(12) United States Patent
Tsutsumi

(10) Patent No.: US 9,178,269 B2
(45) Date of Patent: Nov. 3, 2015

(54) WIRELESS APPARATUS

(75) Inventor: Yukako Tsutsumi, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 5 days.

(21) Appl. No.: 13/447,676

(22) Filed: Apr. 16, 2012

(65) Prior Publication Data

US 2013/0016029 A1    Jan. 17, 2013

(30) Foreign Application Priority Data

Jul. 13, 2011 (JP) ................................. 2011-155138

(51) Int. Cl.
*H01Q 1/38* (2006.01)
*H01Q 1/22* (2006.01)

(52) U.S. Cl.
CPC .... *H01Q 1/2283* (2013.01); *H01L 2224/48091* (2013.01); *H01L 2224/48227* (2013.01); *H01L 2924/15311* (2013.01); *H01L 2924/3011* (2013.01)

(58) Field of Classification Search
USPC .................. 343/700 MS, 851, 895, 702, 904
See application file for complete search history.

(56) References Cited

U.S. PATENT DOCUMENTS

| | | |
|---|---|---|
| 2,283,914 A | 5/1942 | Carter |
| 5,276,455 A | 1/1994 | Fitzsimmons et al. |
| 5,422,650 A | 6/1995 | Hill |
| 5,488,380 A | 1/1996 | Harvey et al. |
| 5,682,143 A | 10/1997 | Brady et al. |
| 5,786,626 A | 7/1998 | Brady et al. |
| 5,972,156 A | 10/1999 | Brady et al. |
| 6,078,259 A | 6/2000 | Brady et al. |
| 6,137,453 A | 10/2000 | Wang et al. |
| 6,249,242 B1 | 6/2001 | Sekine et al. |
| 6,271,793 B1 | 8/2001 | Brady et al. |
| 6,662,430 B2 | 12/2003 | Brady et al. |
| 6,717,544 B2 | 4/2004 | Nagasaku et al. |
| 6,770,955 B1 | 8/2004 | Coccioli et al. |

(Continued)

FOREIGN PATENT DOCUMENTS

| | | |
|---|---|---|
| JP | 5-327329 A | 12/1993 |
| JP | 8-088581 A | 4/1996 |

(Continued)

OTHER PUBLICATIONS

Related U.S. Appl. No. 13/178,967, filed Jul. 8, 2011; Tsutsumi; Radio Device.

(Continued)

*Primary Examiner* — Hoang V Nguyen
*Assistant Examiner* — Hai Tran
(74) *Attorney, Agent, or Firm* — Holtz, Holtz, Goodman & Chick PC

(57) ABSTRACT

According to one embodiment, a wireless apparatus includes an antenna, a semiconductor chip and a board. The antenna comprises a radiating element includes a main radiating part. The semiconductor chip is connected with the antenna. The board has a first surface and a second surface, terminals are arranged on the first surface, and the semiconductor chip is arranged on the second surface. The main radiating part is arranged outside a first region and a second region, the first region is defined by imaginary lines passing through centers of peripheral terminals of the terminals, the second region is defined as a region where the first region is orthogonally projected onto the second surface.

20 Claims, 15 Drawing Sheets

(56) References Cited

U.S. PATENT DOCUMENTS

| | | |
|---|---|---|
| 6,833,806 B2 | 12/2004 | Nagasaku et al. |
| 6,906,677 B2 | 6/2005 | Yamamoto et al. |
| 7,154,432 B2 | 12/2006 | Nagasaku et al. |
| 7,295,161 B2 | 11/2007 | Gaucher et al. |
| 7,329,950 B2 | 2/2008 | Khorram |
| 7,382,331 B2 | 6/2008 | Kurashima et al. |
| 7,518,221 B2 | 4/2009 | Gaucher et al. |
| 7,545,329 B2 | 6/2009 | Gaucher et al. |
| 7,559,131 B2 | 7/2009 | Credelle et al. |
| 7,580,001 B2 | 8/2009 | Tsai et al. |
| 7,586,193 B2 | 9/2009 | Weste |
| 7,619,529 B2 | 11/2009 | Goff et al. |
| 7,768,456 B2 | 8/2010 | Tsutsumi et al. |
| 7,782,624 B2 | 8/2010 | Fujii |
| 8,123,131 B2 | 2/2012 | Sawachi |
| 8,330,259 B2 | 12/2012 | Soler Castany et al. |
| 2005/0169544 A1 | 8/2005 | Clark |
| 2006/0033664 A1 | 2/2006 | Soler Castany et al. |
| 2006/0151614 A1 | 7/2006 | Nishizawa et al. |
| 2006/0256018 A1 | 11/2006 | Soler Castany et al. |
| 2007/0120742 A1 | 5/2007 | Soler Castany et al. |
| 2007/0194427 A1 | 8/2007 | Choi et al. |
| 2007/0200708 A1 | 8/2007 | Hayama et al. |
| 2007/0273600 A1 | 11/2007 | Tsujimura et al. |
| 2008/0158091 A1 | 7/2008 | Imaoka et al. |
| 2008/0158094 A1 | 7/2008 | Rofougaran |
| 2008/0231518 A1* | 9/2008 | Tsutsumi et al. ...... 343/700 MS |
| 2009/0085810 A1 | 4/2009 | Soler Castany et al. |
| 2011/0309893 A1 | 12/2011 | Kawamura et al. |
| 2012/0075147 A1 | 3/2012 | Tsutsumi et al. |
| 2012/0193810 A1 | 8/2012 | Tsutsumi et al. |
| 2012/0249380 A1 | 10/2012 | Soler Castany et al. |
| 2012/0319913 A1 | 12/2012 | Tsutsumi et al. |
| 2013/0016015 A1 | 1/2013 | Tsutsumi |

FOREIGN PATENT DOCUMENTS

| | | |
|---|---|---|
| JP | 8-213419 A | 8/1996 |
| JP | 10-013296 A | 1/1998 |
| JP | 11-261456 A | 9/1999 |
| JP | 2000-174543 A | 6/2000 |
| JP | 2001-196824 A | 7/2001 |
| JP | 2001-203519 A | 7/2001 |
| JP | 2001196829 A | 7/2001 |
| JP | 2005-228226 A | 8/2005 |
| JP | 2006-505973 A | 2/2006 |
| JP | 2007-267217 A | 10/2007 |
| JP | 2007-300266 A | 11/2007 |
| JP | 2007-312354 A | 11/2007 |
| JP | 2008-028691 A | 2/2008 |
| JP | 2008-035033 A | 2/2008 |
| JP | 4121860 B2 | 5/2008 |
| JP | 2008-141215 A | 6/2008 |
| JP | 2008131215 A | 6/2008 |
| JP | 2008-167036 A | 7/2008 |
| JP | 2008160949 A | 7/2008 |
| JP | 2008-259250 A | 10/2008 |
| JP | 2010-021456 A | 1/2010 |
| JP | 2010-109466 A | 5/2010 |
| JP | 2010-183055 A | 8/2010 |
| JP | 4523223 B2 | 8/2010 |
| JP | 2011-130254 A | 6/2011 |
| WO | WO 96/13793 A1 | 5/1996 |
| WO | WO 2004/042868 A1 | 5/2004 |

OTHER PUBLICATIONS

U.S. Appl. No. 13/782,552; First Named Inventor: Yukako Tsutsumi; Title: "Wireless Device"; filed Mar. 1, 2013.
Japanese Office Action dated May 7, 2013 (and English translation thereof) in counterpart Japanese Application No. 2011-155138.
Japanese Office Action dated Jul. 23, 2013 (and English translation thereof) in counterpart Japanese Application No. 2011-155138.
U.S. Appl. No. 13/344,848; First Named Inventor: Yukako Tsutsumi; Title: "Wireless Apparatus and Wireless System"; filed Jan. 6, 2012.
U.S. Appl. No. 13/477,464; First Named Inventor: Yukako Tsutsumi; Title: "Wireless Apparatus"; filed May 22, 2012.
U.S. Appl. No. 13/542,149; First Named Inventor: Yukako Tsutsumi; filed Jul. 5, 2012; Title: "Antenna Device and Wireless Apparatus".
Japanese Office Action dated Mar. 4, 2014 in counterpart Japanese Application No. 2012-271402.

* cited by examiner

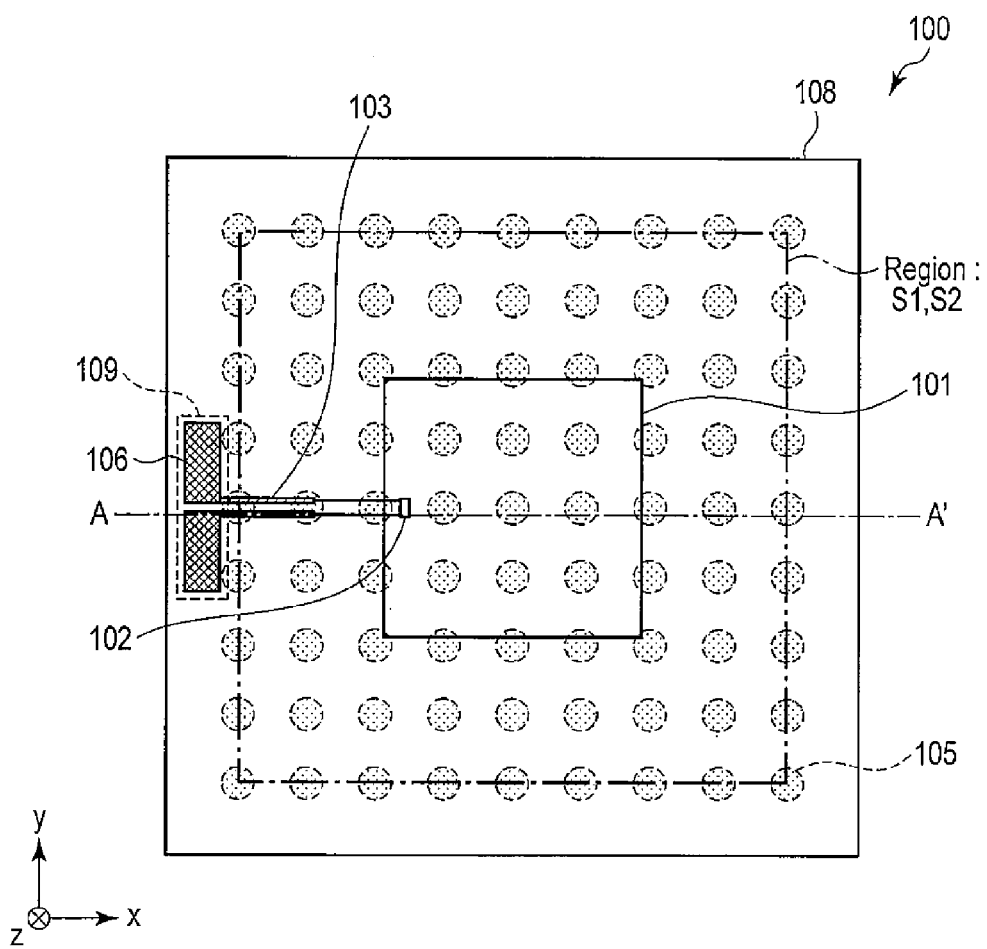
F I G. 1A
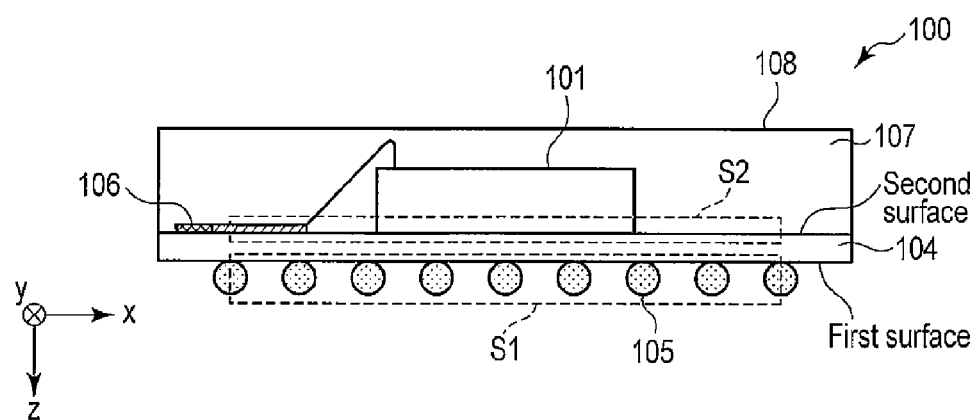
F I G. 1B

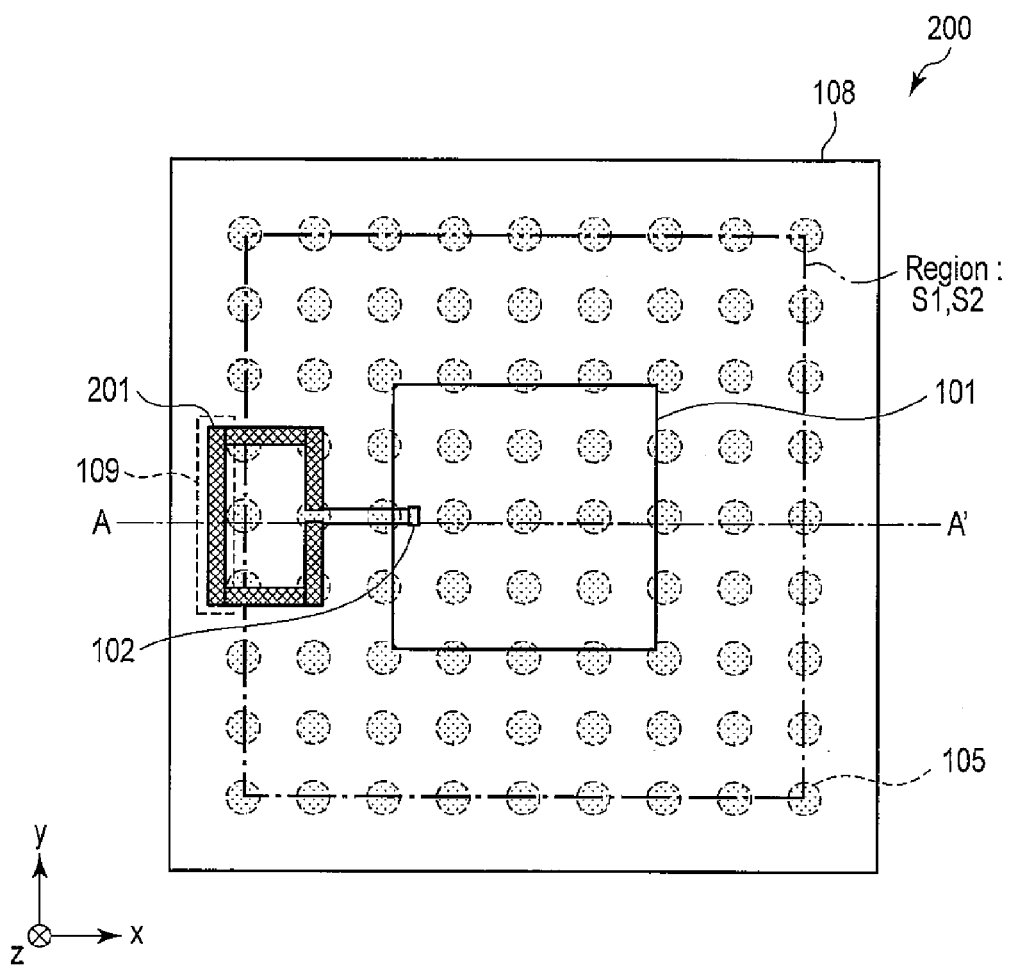
F I G. 2A
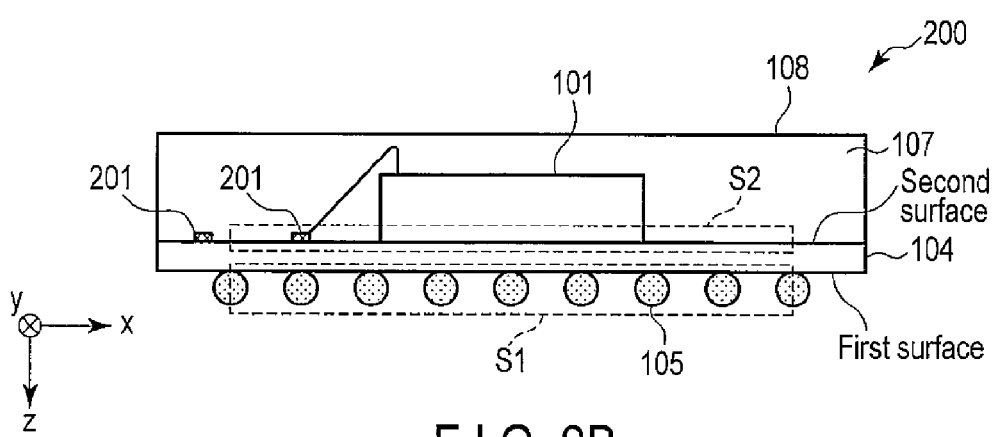
F I G. 2B

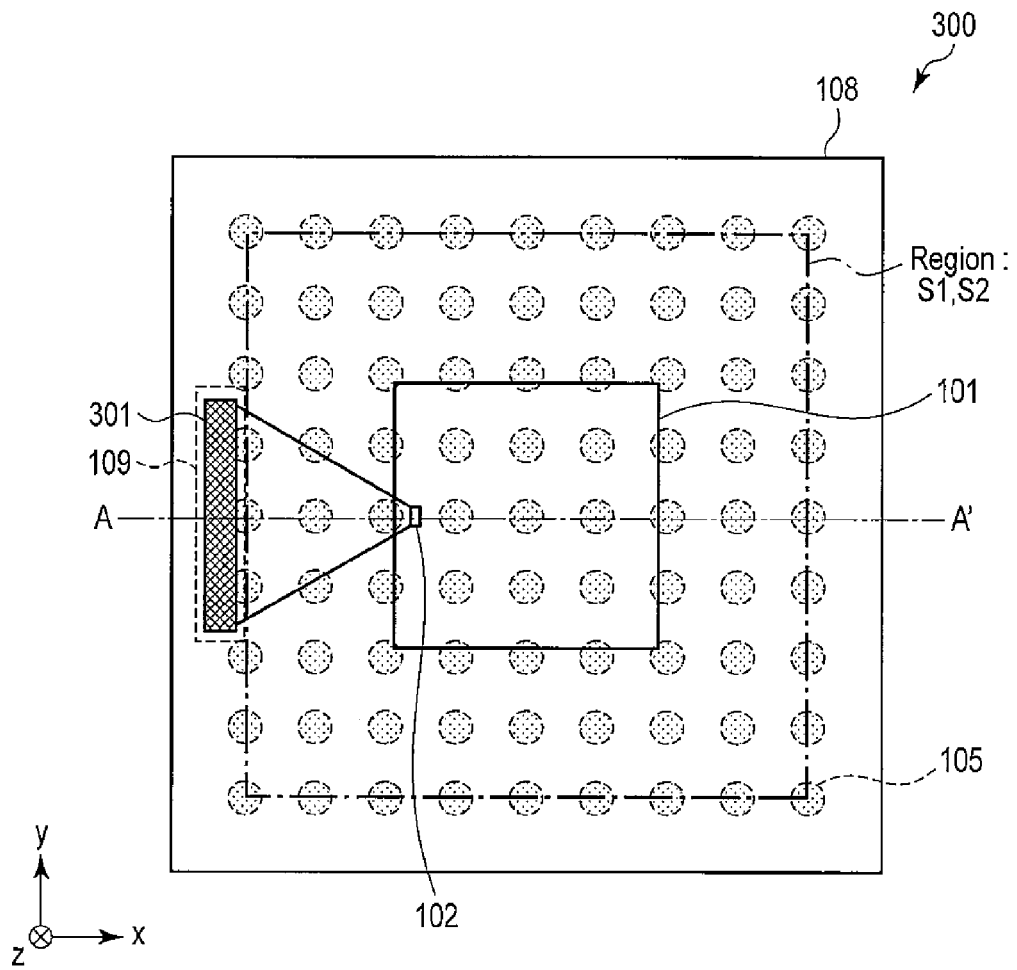
F I G. 3A
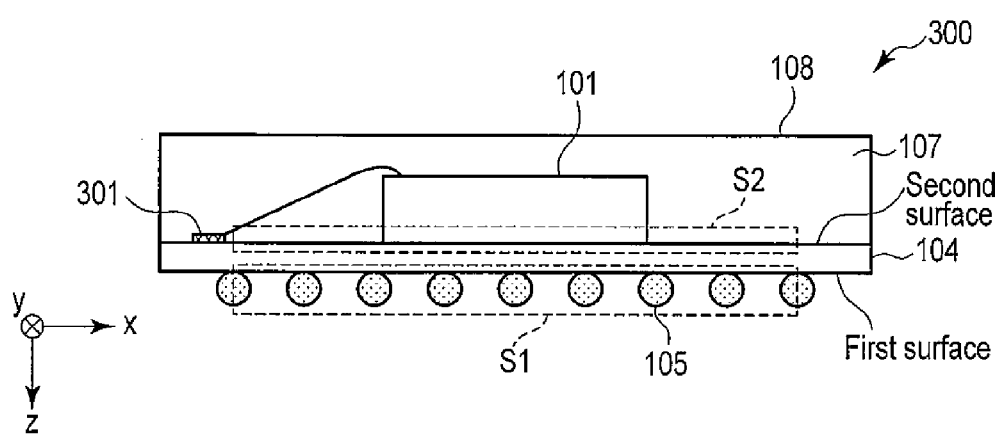
F I G. 3B

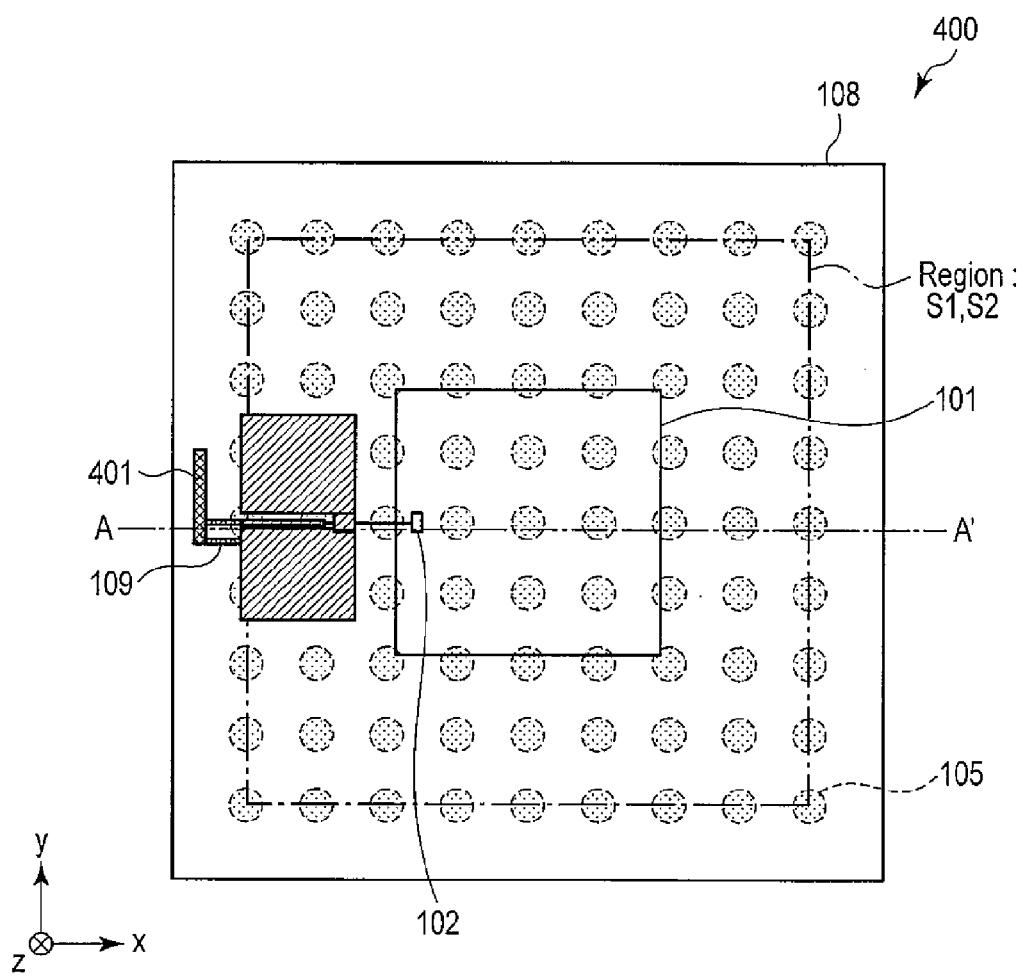
F I G. 4A
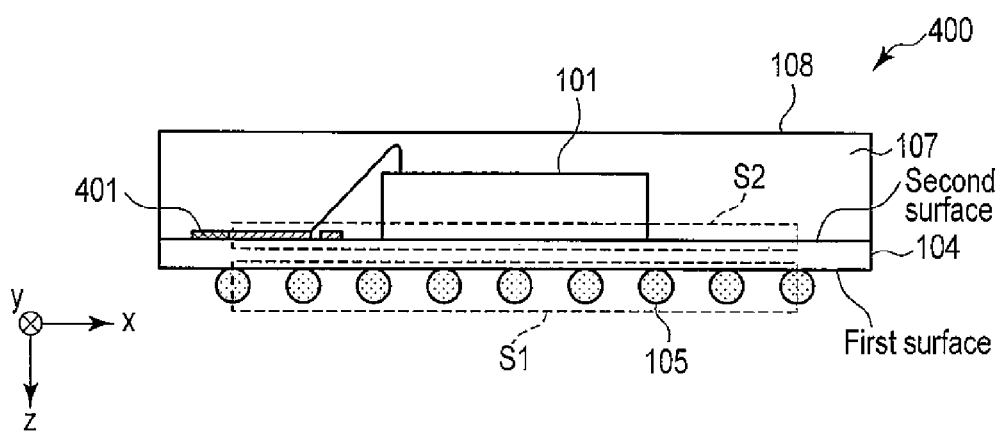
F I G. 4B

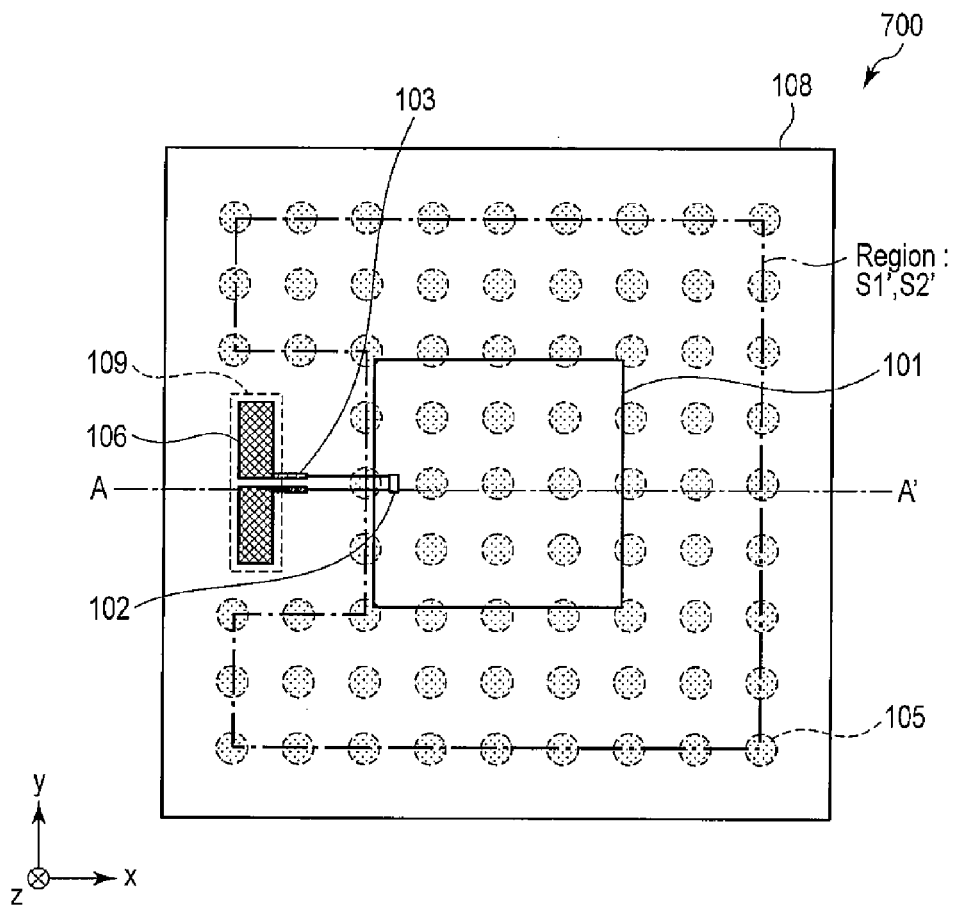
F I G. 7A
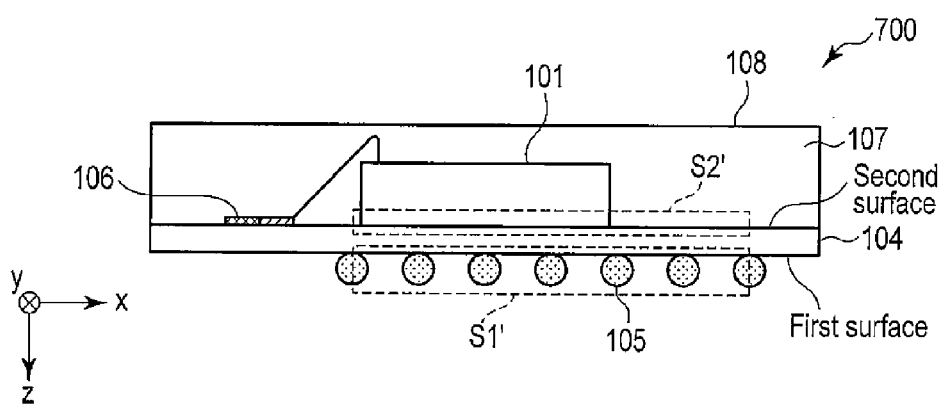
F I G. 7B

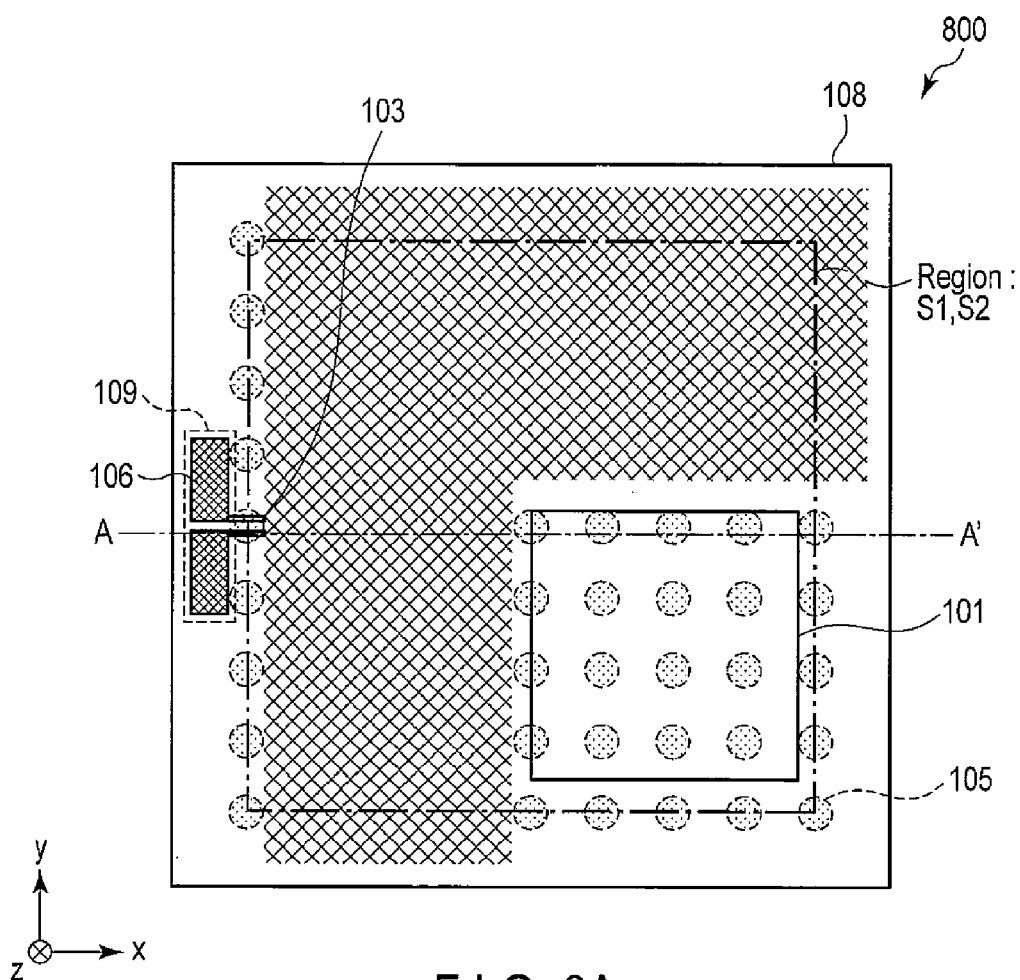
F I G. 8A
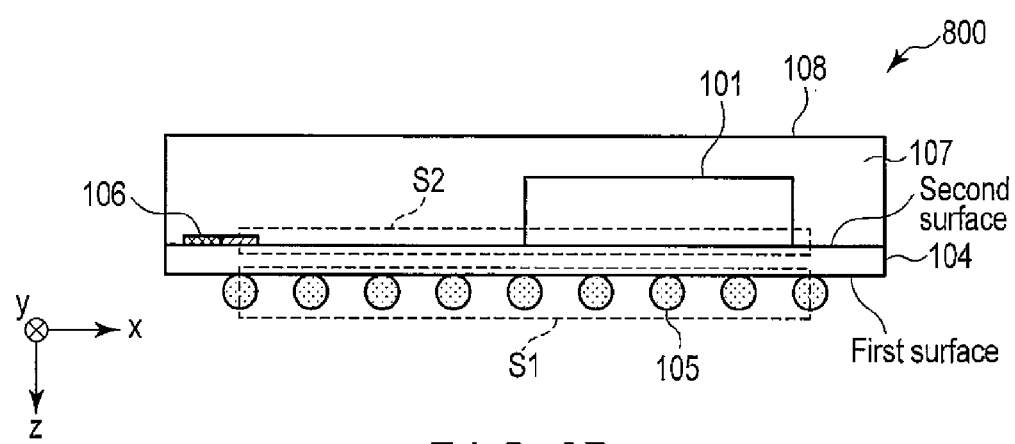
F I G. 8B

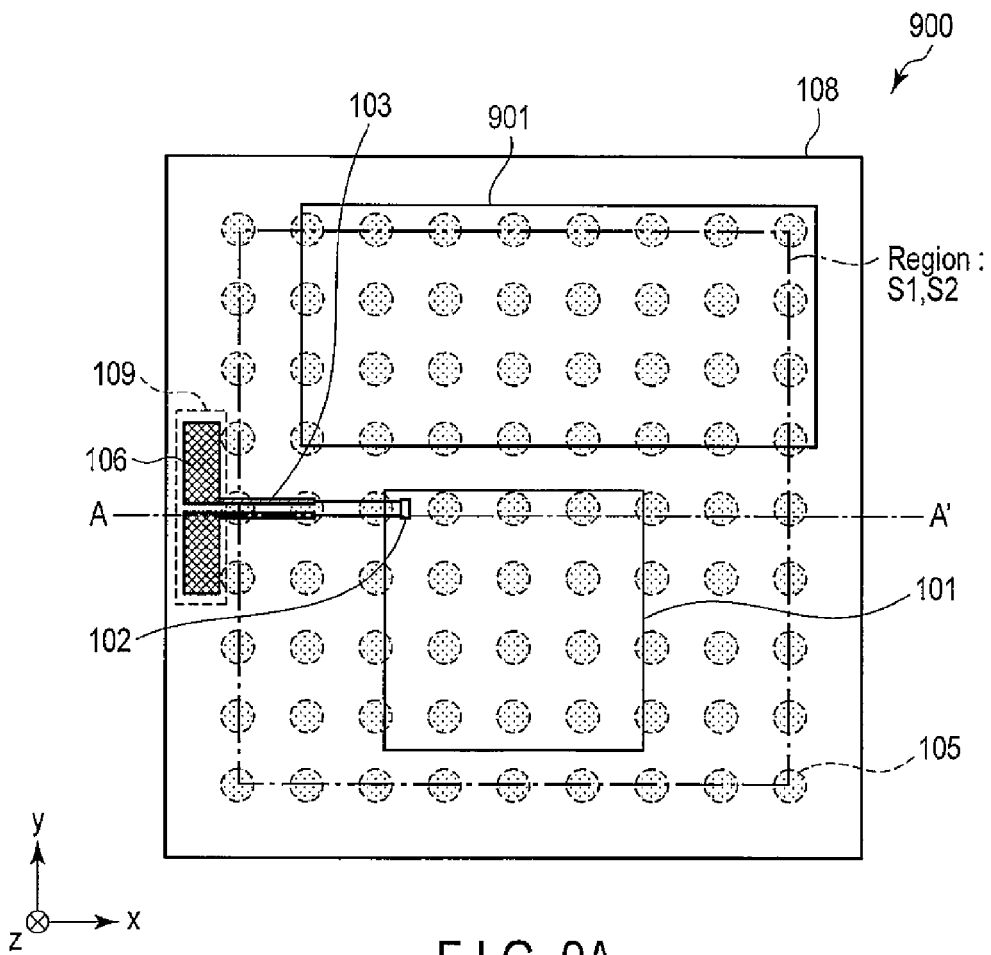
F I G. 9A
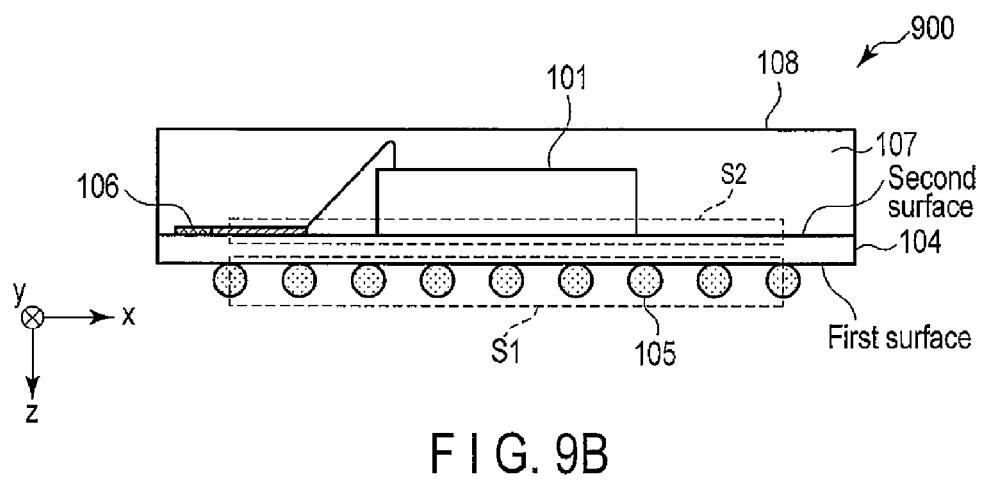
F I G. 9B

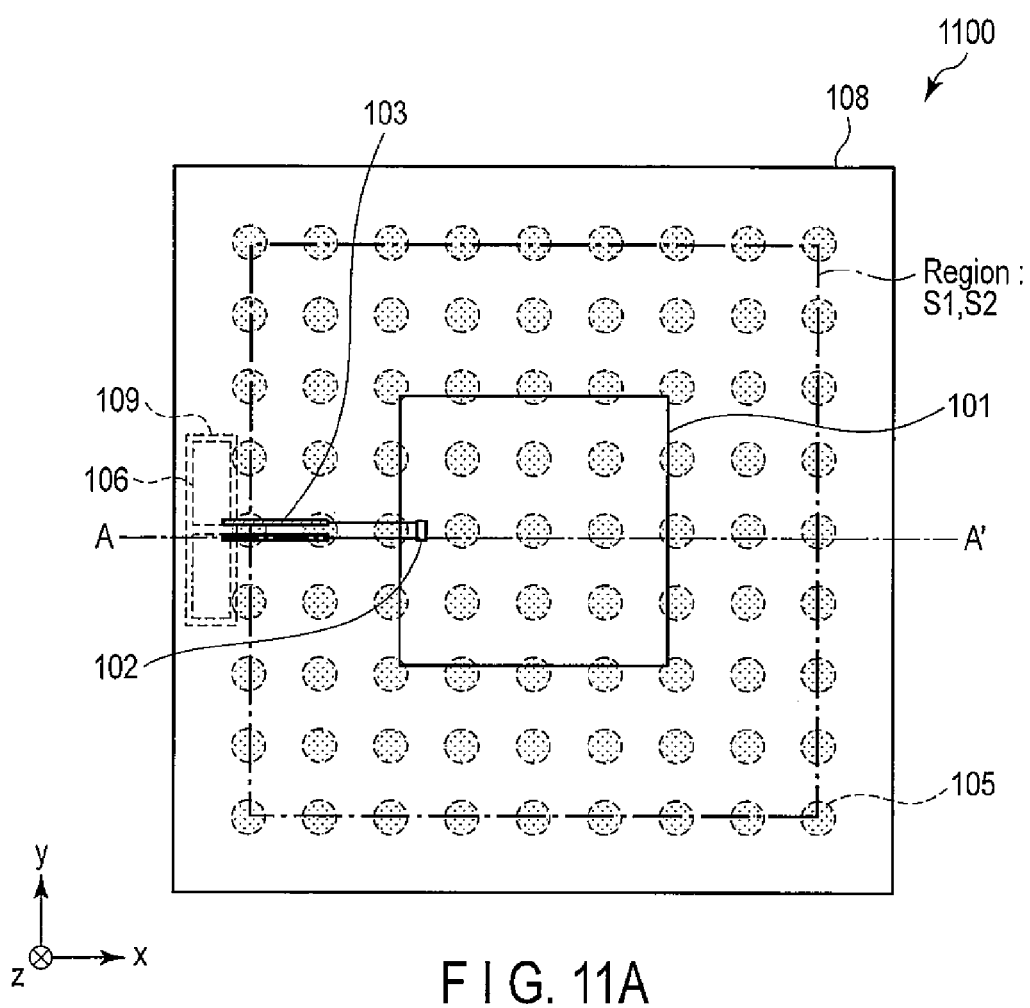
F I G. 11A
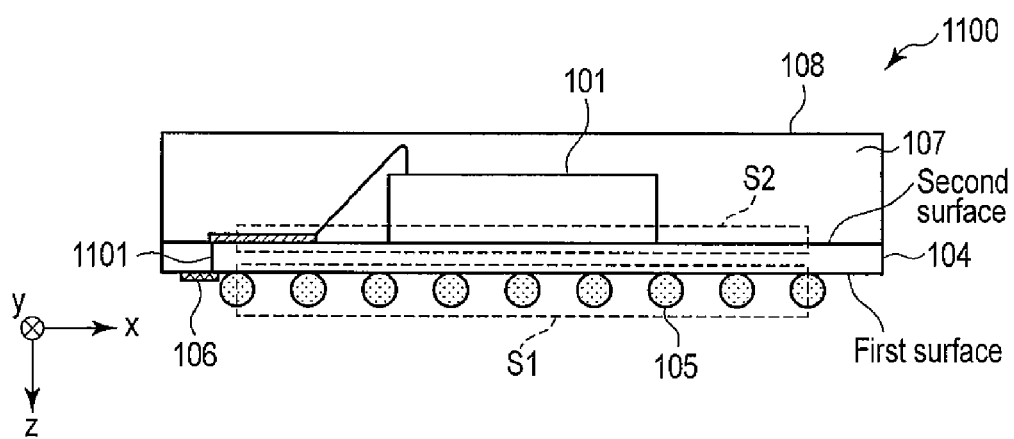
F I G. 11B

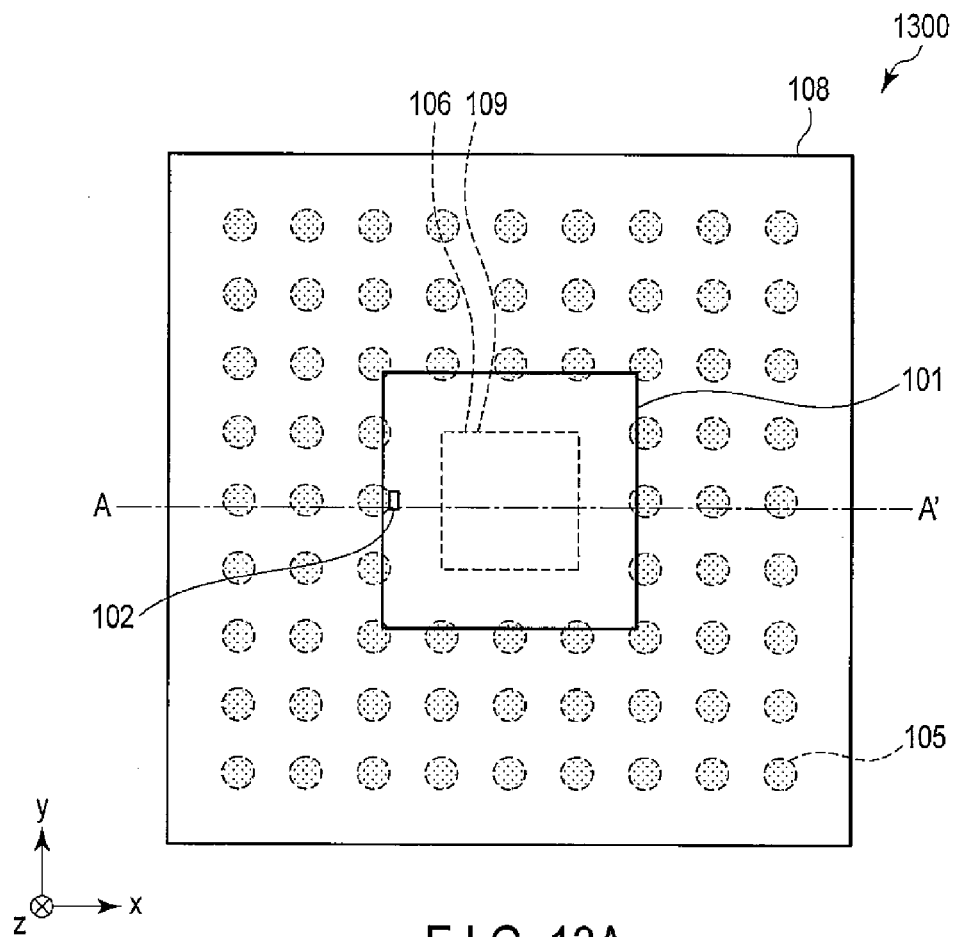
F I G. 13A
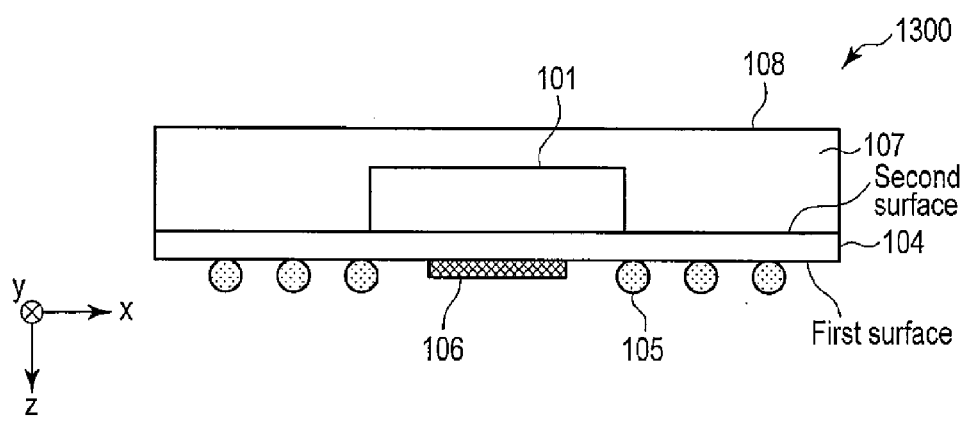
F I G. 13B

WIRELESS APPARATUS

CROSS-REFERENCE TO RELATED APPLICATIONS

This application is based upon and claims the benefit of priority from prior Japanese Patent Application No. 2011-155138, filed Jul. 13, 2011, the entire contents of which are incorporated herein by reference.

FIELD

Embodiments described herein relate generally to a wireless apparatus.

BACKGROUND

There is a technique of forming an antenna element by solder balls on a ball grid array package as a semiconductor package with build-in antenna. In this technique, the volume (scale) of a wireless apparatus can be made small as compared with a case in which an external antenna is added. Furthermore, additional steps are not required for a manufacturing process, thereby reducing the manufacturing cost of the wireless apparatus.

BRIEF DESCRIPTION OF THE DRAWINGS

FIG. 1A is a perspective view illustrating a wireless apparatus according to the first embodiment;

FIG. 1B is a sectional view illustrating the wireless apparatus according to the first embodiment;

FIG. 2A is a perspective view illustrating a wireless apparatus according to the first modification of the first embodiment;

FIG. 2B is a sectional view illustrating the wireless apparatus according to the first modification;

FIG. 3A is a perspective view illustrating a wireless apparatus including another example of a loop antenna according to the first modification;

FIG. 3B is a sectional view illustrating the wireless apparatus including the other example of the loop antenna according to the first modification;

FIG. 4A is a perspective view illustrating a wireless apparatus according to the second modification of the first embodiment;

FIG. 4B is a sectional view illustrating the wireless apparatus according to the second modification;

FIG. 7A is a perspective view illustrating a wireless apparatus according to the fifth modification of the first embodiment;

FIG. 7B is a sectional view illustrating the wireless apparatus according to the fifth modification;

FIG. 8A is a perspective view illustrating a wireless apparatus according to the second embodiment;

FIG. 8B is a sectional view illustrating the wireless apparatus according to the second embodiment;

FIG. 9A is a perspective view illustrating a wireless apparatus according to a modification to the second embodiment;

FIG. 9B is a sectional view illustrating the wireless apparatus according to the modification to the second embodiment;

FIG. 11A is a perspective view illustrating a wireless apparatus according to the fourth embodiment;

FIG. 11B is a sectional view illustrating the wireless apparatus according to the fourth embodiment;

FIG. 13A is a perspective view illustrating a wireless apparatus according to a modification to the fifth embodiment;

FIG. 13B is a sectional view illustrating the wireless apparatus according to the modification;

DETAILED DESCRIPTION

Figure 5A:
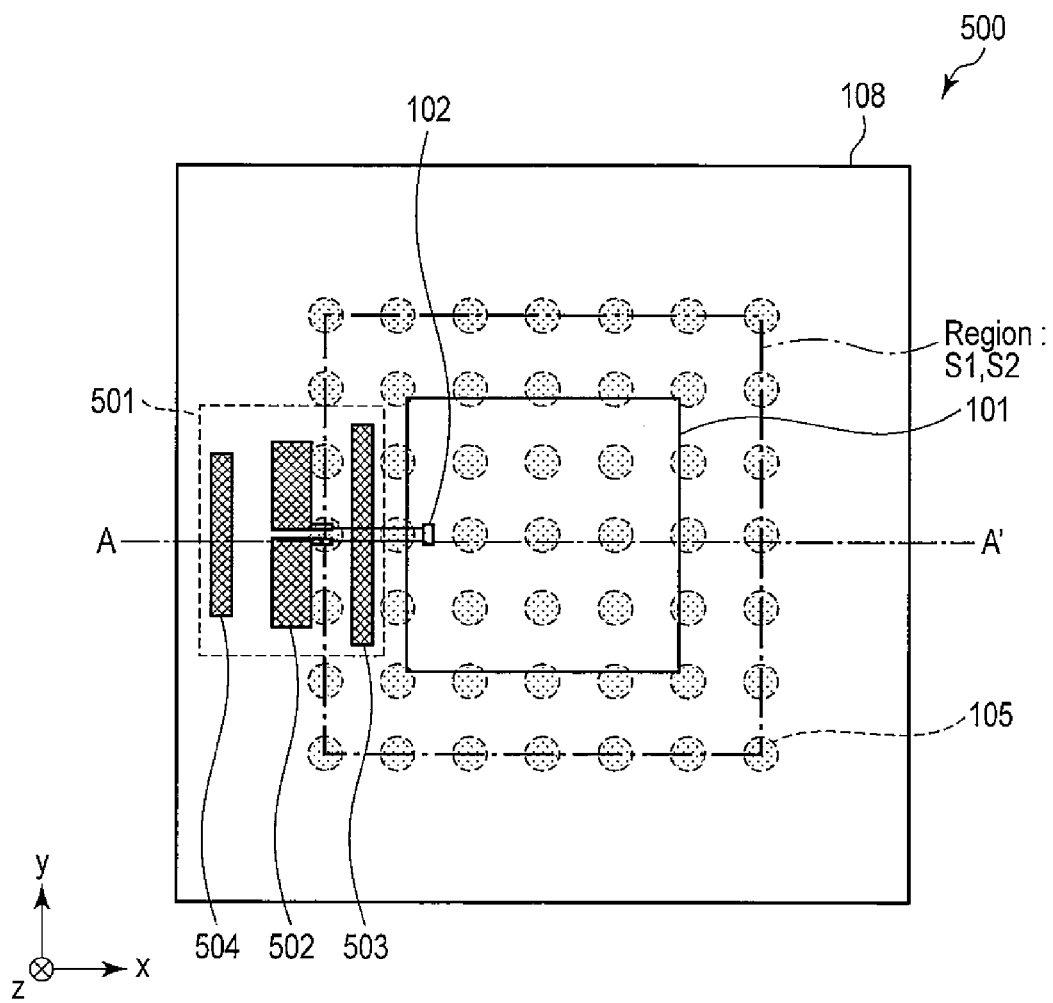
FIG. 5A is a perspective view illustrating a wireless apparatus according to the third modification of the first embodiment.

Using solder balls for an antenna decreases the number of pins of a package usable for a connection between a wireless chip and a board, thereby lowering the degree of freedom of wiring. For example, it is necessary to decrease the number of pins used for grounding in order to decrease the number of pins except for pins for the antenna. To the contrary, increasing the number of pins of the package to obtain a sufficient number of pins increases the size of the package or decreases the intervals between the pins, thereby lowering the degree of freedom of wiring.

In general, according to one embodiment, a wireless apparatus includes an antenna, a semiconductor chip and a board. The antenna comprises a radiating element comprising a main radiating part, and the main radiating part is a portion with highest radiation intensity at an operating frequency. The semiconductor chip is connected with the antenna. The board has a first surface and a second surface, a plurality of terminals are arranged on the first surface, and the semiconductor chip is arranged on the second surface. The main radiating part is arranged outside a first region and a second region, the first region is a region defined by imaginary lines passing through centers of peripheral terminals among the terminals, and the second region is defined as a region where the first region is orthogonally projected onto the second surface.

A wireless apparatus according to the present embodiments will be described in detail below with reference to the accompanying drawings. Note that in the following embodiments, parts with the same reference numerals perform the same operation, and a repetitive description thereof will be omitted.

First Embodiment

A wireless apparatus according to the first embodiment will be described with reference to FIGS. 1A and 1B. FIG. 1A is a perspective view illustrating a wireless apparatus when seen from the −z direction. FIG. 1B is a sectional view of the wireless apparatus taken along a line A-A' in FIG. 1A.

A wireless apparatus 100 according to the first embodiment includes a semiconductor chip 101, an antenna terminal 102, a feed line 103, an antenna 106, a board 104, package terminals 105, and an encapsulation resin 107. These components are collectively called a semiconductor package 108.

The semiconductor chip 101 is obtained by forming a pattern with copper, aluminum, gold, or the like in the interior or on the surface of the semiconductor substrate using a material such as silicon, silicon germanium, or gallium arsenide. The semiconductor chip 101 executes signal processing associated with wireless communication. The signal processing is a general signal processing, and a detailed description thereof will be omitted.

Note that the semiconductor chip 101 may be made of a dielectric substrate, magnetic substrate, metal, or a combination thereof. The semiconductor chip 101 and the semiconductor package 108 including the semiconductor chip 101 are square in FIGS. 1A and 1B. Their shape, however, is not limited to a square, and may be a rectangular shape, a polygonal shape other than a rectangular shape, a circular shape, or another complex shape. Furthermore, although there is one semiconductor chip 101 in the example of FIGS. 1A and 1B, a plurality of semiconductor chips may exist and may be stacked or arranged in parallel.

The antenna terminal 102 is formed on the semiconductor chip 101, and is used for power feeding to the antenna 106. Note that the antenna terminal 102 is formed on the upper surface of the semiconductor chip 101 in the example of FIG. 1A but may be formed on the lower surface of the semiconductor chip 101.

The feed line 103 is, for example, a conductor such as a bonding wire, and connects the antenna terminal 102 of the semiconductor chip 101 with the power feeding port of the antenna 106. Referring to FIG. 1A, the feed line 103 is a Lecher line, which supplies a power to the antenna 106.

The board 104 is an interposer board mounting the semiconductor chip 101, which connects the semiconductor chip 101 with a mounting board (not shown) mounting the semiconductor package 108 through the package terminals 105 formed on the board 104. In the example of FIG. 1A, the package terminals 105 are formed on the lower surface (to also be referred to as a first surface) of the board 104, and the semiconductor chip 101, feed line 103, and antenna 106 are provided on the upper surface (to also be referred to as a second surface) on the opposite side of the lower surface of the board 104.

The package terminals 105 are, for example, solder balls, which are arranged on the board 104. The package terminals 105 electrically connect the semiconductor package 108 with the mounting board.

The encapsulation resin 107 is made of, for example, a thermosetting molding composition obtained by adding silica filler or the like to an epoxy resin as a major component, and is filled in the semiconductor package 108 to protect the semiconductor.

The antenna 106 is formed by the feed line 103 connected with the antenna terminal 102 and a radiating element formed by a metal plate or the like on the board 104. In the example of FIG. 1A, the radiating element formed by the metal plate on the board 104 is connected with the antenna terminal 102 on the semiconductor chip 101 and boding wires, thereby forming a dipole antenna.

A main radiating part in the antenna 106 is arranged outside a region S1 (to also be referred to as a first region) defined by imaginary lines passing through centers of peripheral terminals among the package terminals 105 formed on the first surface, and a region S2 (to also be referred to as a second region) defined as the region which S1 is orthogonally projected onto the second surface. The main radiating part is a conductive portion in which the radiation intensity is highest in the radiating element of the antenna 106 at the operating frequency of the apparatus. In other words, the main radiating part is a portion in which the strength of a current passing through the radiating element is highest and is not cancelled.

In general, a current induced by a current passing through the main radiating part of the antenna 106 flows through the package terminals 105. The induced current changes the impedance characteristics and radiation characteristics of the antenna 106, thereby degrading the antenna characteristics. In particular, if the main radiating part of the antenna 106 is arranged within the diameter of the package terminal 105, the current passing through the radiating element of the antenna 106 causes a strong induced current to flow through the package terminals 105. By arranging the main radiating part of the antenna 106 outside the regions S1 and S2, it is possible to decrease a current which is caused by a current passing through a main radiating part 109 of the antenna 106, and induced in the package terminals 105 or wiring lines (not shown) connected to the package terminals 105.

Even if all the package terminals 105 are used to connect the semiconductor chip 101 with the board (not shown) on which the semiconductor package 108 is mounted, the antenna characteristics do not degrade, thereby enabling to improve the degree of freedom of the wiring.

More specifically, in the example illustrated in FIG. 1A, the main radiating part 109 of the antenna 106 is arranged outside the regions S1 and S2 on the board 104. By arranging the main radiating part 109 in such a way, it is possible to keep a distance between the package terminals 105 and the main radiating part 109 of the antenna 106.

As the distance between the main radiating part 109 of the antenna 106 and the package terminals 105 arranged on the outer peripheral portion of the region S1 is longer, like ¼, ½, ¾, or one wavelength, an influence exerted on the antenna characteristics decreases.

A bump or the like may connect the antenna terminal 102 with the antenna 106. The antenna 106 is a symmetrical dipole antenna in the example of FIGS. 1A and 1B. The present embodiment, however, is not limited to this. The antenna 106 may have an asymmetrical shape, and may be an inverted-F antenna, a patch antenna, a Yagi antenna, a dielectric antenna, or another antenna. The number of antennas 106 is not limited to one, and may be two or more.

Since the main radiating part 109 of the antenna 106 is provided outside the regions S1 and S2 on the board 104, the main radiating part 109 of the antenna 106 readily radiates to the exterior of the board 104.

FIGS. 2A and 2B illustrate the first modification of a wireless apparatus including another antenna. FIG. 2A is a perspective view illustrating a wireless apparatus when seen from the −z direction. FIG. 2B is a sectional view taken along a line A-A' in FIG. 2A and illustrating the wireless apparatus.

The antenna of a wireless apparatus 200 illustrated in FIG. 2A is a loop antenna 201 in which a loop is formed by a metal plate on the board 104.

FIGS. 3A and 3B illustrate a modification of the loop antenna illustrated in FIGS. 2A and 2B. FIG. 3A is a perspective view illustrating a wireless apparatus when seen from the −z direction. FIG. 3B is a sectional view taken along a line A-A' in FIG. 3A and illustrating the wireless apparatus.

The antenna of a wireless apparatus 300 illustrated in FIGS. 3A and 3B is a loop antenna 301 formed by the feed line 103 (bonding wire) and a metal plate on the board 104.

For the loop antenna 201 or 301 illustrated in FIGS. 2A and 2B or 3A and 3B, the position of the main radiating part of the antenna 106 varies depending on the operating frequency of the loop antenna. If, for example, the perimeter of the loop is nearly equal to one wavelength at the operating frequency, the main radiating part of the loop antenna is arranged at the position of the power feeding port or at an approximately half wavelength distance from the power feeding port along the loop. If the perimeter of the loop is nearly equal to a $\frac{3}{2}$ wavelength at the operating frequency, the main radiating part of the loop antenna is positioned at an approximately $\frac{1}{4}$, $\frac{3}{4}$, or $\frac{5}{4}$ wavelength distance from the power feeding port along the loop.

The loop antenna 201 or 301 illustrated in FIG. 2A or 3A has a perimeter of about one or $\frac{3}{2}$ wavelength at the operating frequency. If, therefore, the perimeter is about one wavelength at the operating frequency, the main radiating part of the antenna 106 is positioned at an approximately half wavelength distance from the power feeding port along the loop. If the perimeter is about a $\frac{3}{2}$ wavelength at the operating frequency, the main radiating part of the antenna 106 is positioned at an approximately $\frac{3}{4}$ wavelength distance from the power feeding port along the loop. If the main radiating part 109 of the antenna 106 is arranged outside the regions S1 and S2 as described above, part of the antenna may be included in the region S2.

FIGS. 4A and 4B illustrate the second modification of the antenna. FIG. 4A is a perspective view illustrating a wireless apparatus when seen from the −z direction. FIG. 4B is a sectional view taken along a line A-A' in FIG. 4A and illustrating the wireless apparatus.

The antenna of a wireless apparatus 400 illustrate in FIGS. 4A and 4B is an inverted-F antenna 401 formed by a metal plate on the board 104. A main radiating part 109 of the inverted-F antenna 401 is arranged in parallel with the power feeding port connected with the feed line 103.

Figure 5B:
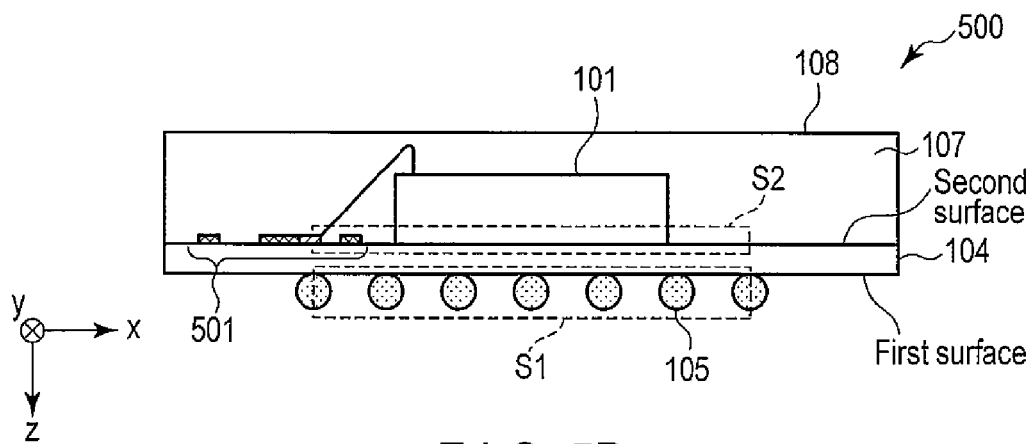
FIG. 5B is a sectional view illustrating the wireless apparatus according to the third modification.

FIGS. 5A and 5B illustrate the third modification of the antenna. FIG. 5A is a perspective view illustrating a wireless apparatus when seen from the −z direction. FIG. 5B is a sectional view taken along a line A-A' in FIG. 5A and illustrating the wireless apparatus. The antenna of a wireless apparatus 500 illustrated in FIGS. 5A and 5B is a Yagi antenna 501 formed by a metal plate on the board 104. The Yagi antenna 501 includes a feeding element 502, a reflector 503, and a director 504. The feeding element 502 serves as a main radiating part 109 of the Yagi antenna 501.

Figure 6A:
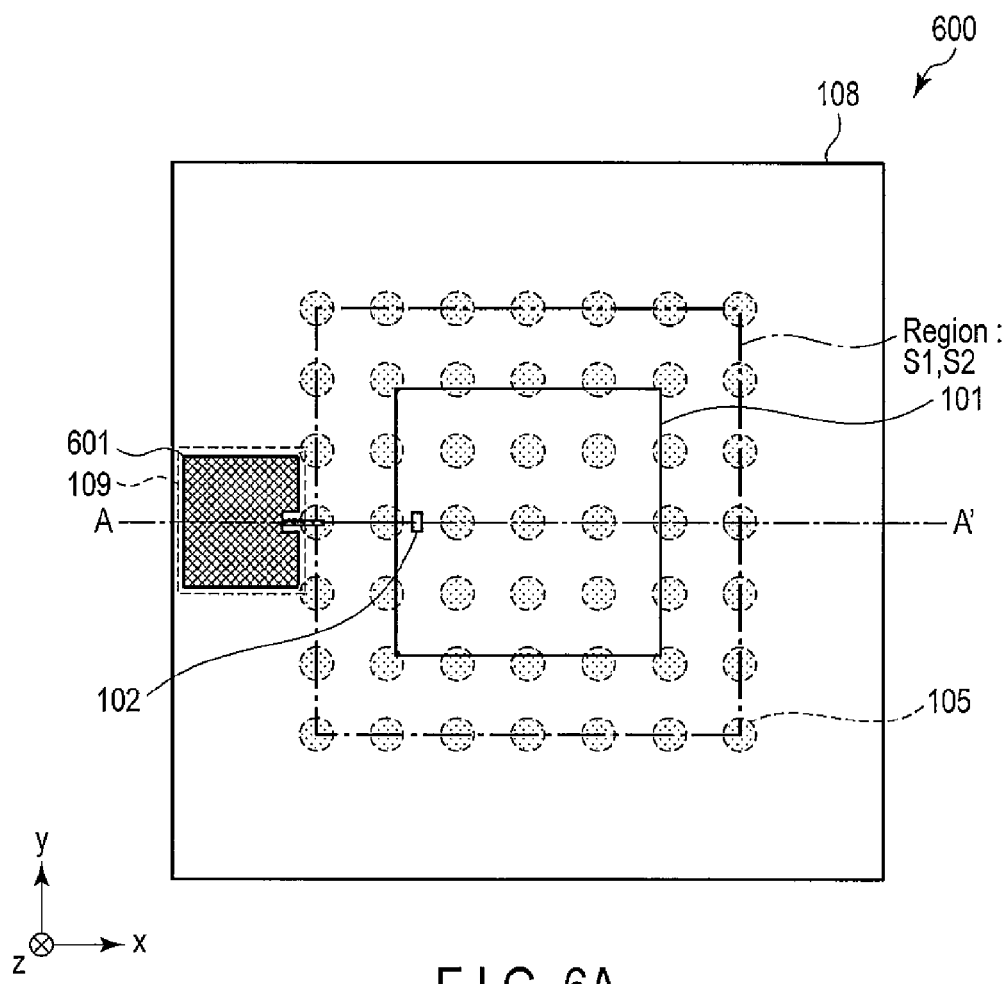
FIG. 6A is a perspective view illustrating a wireless apparatus according to the fourth modification of the first embodiment.
Figure 6B:
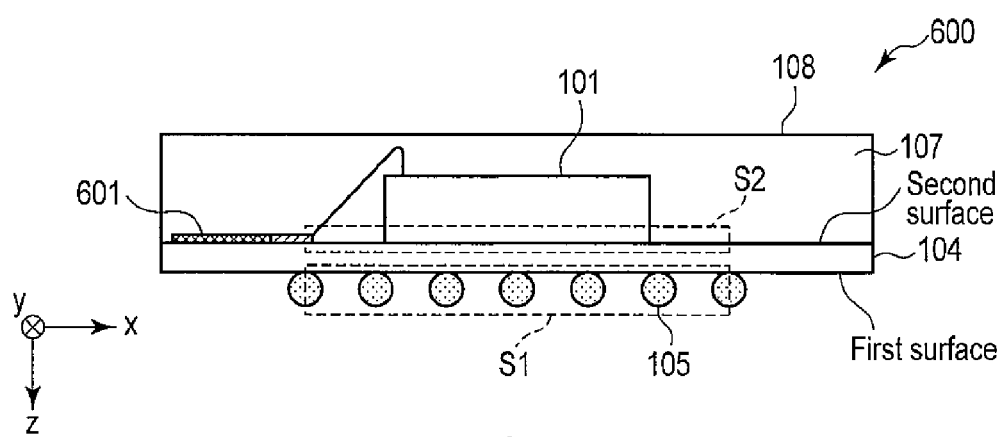
FIG. 6B is a sectional view illustrating the wireless apparatus according to the fourth modification.

FIGS. 6A and 6B illustrate the fourth modification of the antenna. FIG. 6A is a perspective view illustrating a wireless apparatus when seen from the −z direction. FIG. 6B is a sectional view taken along a line A-A' in FIG. 6A and illustrating the wireless apparatus. The antenna of a wireless apparatus 600 illustrated in FIGS. 6A and 6B is a patch antenna 601 in which a patch element is formed by a metal plate on the board 104. The patch element of the patch antenna 601 serves as a main radiating part 109.

In the first embodiment, the package terminals 105 are arranged in a square shape, which is symmetrical. The present embodiment, however, is not limited to this, and package terminals 105 may be arranged in any shape.

FIGS. 7A and 7B illustrate an example of a wireless apparatus according to the fifth modification to the first embodiment. The arrangement of package terminals of a wireless apparatus 700 according to the fifth modification is different from that of the wireless apparatus 100 according to the first embodiment. As illustrated in FIG. 7A, a region S1' (which is surrounded by a chain line in FIG. 7A) obtained by connecting the centers of a plurality of package terminals 105 on the outermost peripheral portion has a concave shape. Even in such a shape, the main radiating part of the antenna 106 need only be arranged outside the regions S1' and a region S2' obtained by orthogonally projecting the region S1' on the second surface.

According to the above-described first embodiment, by arranging the main radiating part of an antenna on a board outside a region surrounded by connecting the centers of a plurality of package terminals on the outermost peripheral portion among package terminals and a region obtained by orthogonally projecting that region on an opposite surface, an induced current passing through the package terminals is suppressed not to degrade the antenna characteristics. Since the package terminals are not used as an antenna, it is possible to ensure a required number of package terminals without increasing the number of package terminals of the board, thereby increasing the degree of freedom of wiring.

Second Embodiment

A wireless apparatus according to the second embodiment will be described with reference to FIGS. 8A and 8B.

FIG. 8A is a perspective view illustrating a wireless apparatus when seen from the −z direction. FIG. 8B is a sectional view taken along a line A-A' in FIG. 8A and illustrating the wireless apparatus when seen from the −y direction.

A wireless apparatus 800 according to the second embodiment has almost the same arrangement as that of the wireless apparatus 100 according to the first embodiment. A different point is that a semiconductor chip 101 is arranged at a position shifted from the center. In the example of FIG. 8A, the semiconductor chip 101 is arranged at a lower right position with respect to the center of a board 104. That is, the semiconductor chip 101 is arranged farther from an antenna 106. This arrangement enables to widen a region (a crosshatched portion in FIG. 8A) which is in the proximity of the antenna 106 and does not overlap the semiconductor chip 101 and on which the semiconductor chip 101 has a small influence. It is, therefore, possible to form, near the antenna 106 and in a wide region, a component which should be arranged near the antenna 106, such as a balun for converting a single phase signal into a differential signal.

A wireless apparatus according to a modification to the second embodiment will be described with reference to FIGS. 9A and 9B.

FIG. 9A is a perspective view illustrating a wireless apparatus when seen from the −z direction. FIG. 9B is a sectional view taken along a line A-A' in FIG. 9A and illustrating the wireless apparatus when seen from the −y direction. In a wireless apparatus 900 according to the modification to the second embodiment, as illustrated in FIG. 9A, the semiconductor chip 101 is arranged at a lower position with respect to the center of the board 104, and therefore, and it is therefore possible to widen an upper region on the second surface of the board 104. A new semiconductor chip 901 is arranged in the upper region. Note that although the two semiconductor chips 101 are arranged in this example, the number of semiconductor chips is not limited to two and a plurality of semiconductor chips may be arranged within the region of the board 104.

According to the above-described second embodiment, by arranging a semiconductor chip at a position shifted from the center of a board, it is possible to widen a region in which other components can be arranged. Therefore, even if the number of package terminals is not increased, it is possible to improve the degree of freedom of wiring or the arrangement of components without degradation in antenna characteristics.

Third Embodiment

A wireless communication apparatus according to the third embodiment will be described with reference to FIGS. 10A and 10B.

Figure 10A:
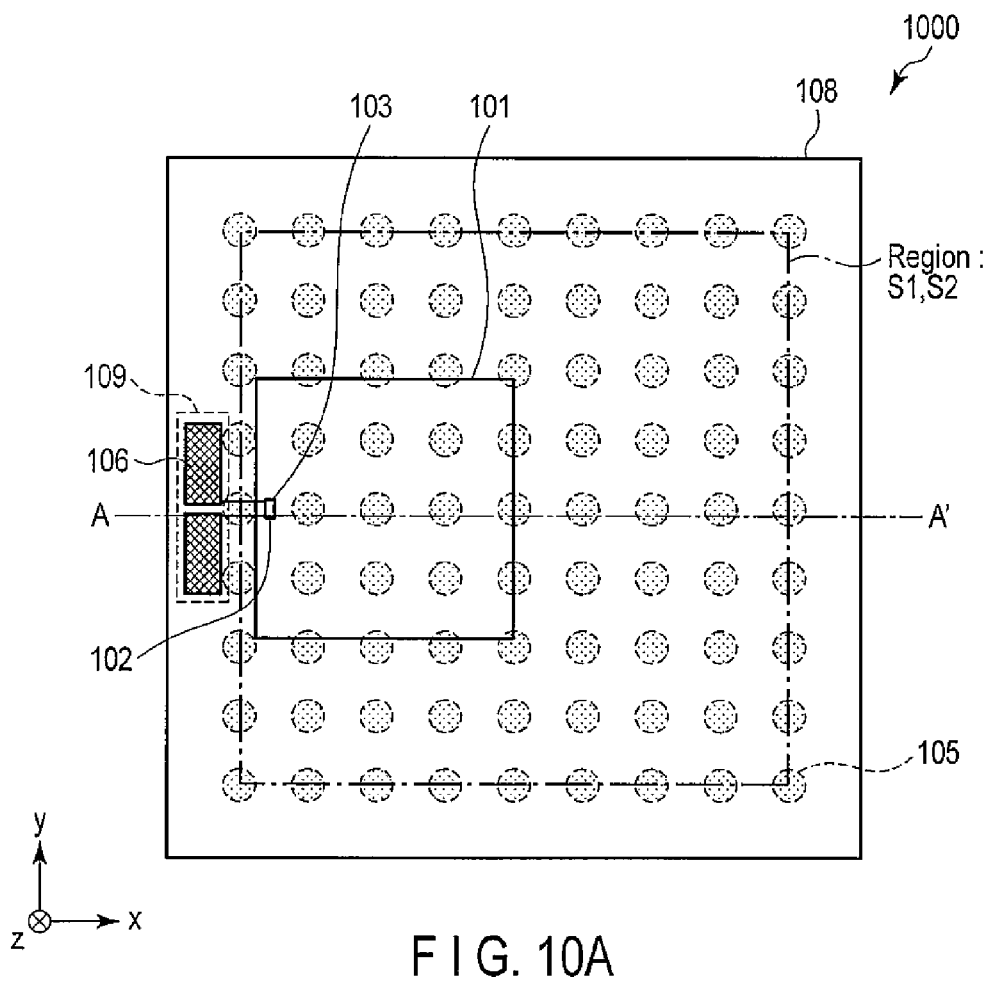
FIG. 10A is a perspective view illustrating a wireless apparatus according to the third embodiment.
Figure 10B:
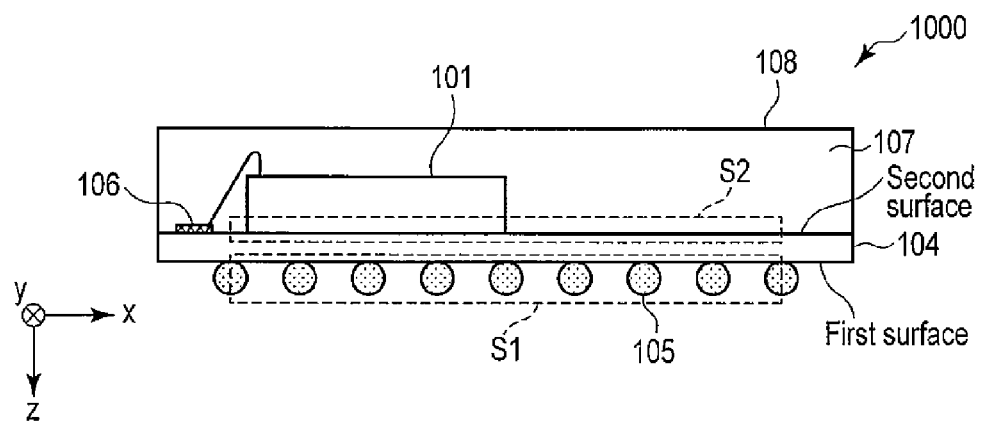
FIG. 10B is a sectional view illustrating the wireless apparatus according to the third embodiment.

FIG. 10A is a perspective view illustrating a wireless apparatus when seen from the −z direction. FIG. 10B is a sectional view taken along a line A-A' in FIG. 10A and illustrating a wireless apparatus when seen from the −y direction.

A wireless apparatus 1000 according to the third embodiment has almost the same arrangement as that of the wireless apparatus 100 according to the first embodiment. A different point is that a semiconductor chip 101 is arranged at a position shifted from the center of a board 104 toward an antenna 106. Since the distance between an antenna terminal 102 and the power feeding port of the antenna 106 becomes short, it is possible to shorten the length of a feed line 103, thereby reducing a connection loss. Since it is possible to widen a region far from the antenna 106 other than a region occupied by the semiconductor chip 101 and antenna 106 in regions S1 and S2, it is possible to realize wiring with a high degree of freedom while reducing an influence on the characteristics of the antenna 106.

According to the above-described third embodiment, arranging a semiconductor chip at a position shifted toward an antenna enables to decrease a connection loss. Since it is possible to widen a region far from the antenna in the region S2, it is possible to arrange, at a position far from the antenna, a component which may have an influence on the antenna characteristics, thereby realizing wiring with a high degree of freedom without degradation in antenna characteristics.

Fourth Embodiment

A wireless apparatus according to the fourth embodiment will be described with reference to FIGS. 11A and 11B.

FIG. 11A is a perspective view illustrating a wireless apparatus when seen from the −z direction. FIG. 11B is a sectional view taken along a line A-A' in FIG. 11A and illustrating the wireless apparatus when seen from the −y direction.

A wireless apparatus 1100 according to the fourth embodiment has almost the same arrangement as that of the wireless apparatus 100 according to the first embodiment. A different point is that a main radiating part 109 of an antenna 106 is formed not on a second surface on which a semiconductor chip 101 is mounted but on the same surface as a first surface on which package terminals 105 are arranged. In this embodiment, a feed line 103 on the second surface supplies a power to the antenna 106 formed on the first surface through a via 1101. The via 1101 electrically connects the feed line 103 with the antenna 106.

Note that although the antenna 106 is formed on the first surface in the example of FIGS. 11A and 11B, the present embodiment is not limited to this and the antenna 106 may be arranged within a board 104. That is, the antenna 106 may be formed on a layer between the first surface and the second surface.

According to the above-described fourth embodiment, since the antenna 106 is arranged at a position outside a region obtained by orthogonally projecting the package terminals 105 on the second surface, a current induced in the package terminals or the like is decreased, thereby enabling to prevent degradation in antenna characteristics. Since arranging the antenna 106 on the first surface of the board 104 increases an area usable for wiring on the second surface where there are no package terminals 105, it is possible to improve the degree of freedom of the wiring. Furthermore, since a surface on which the semiconductor chip 101 is arranged is different from that on which the antenna 106 is arranged, it is possible to provide a metal layer between the semiconductor chip 101 and the antenna 106, thereby improving the isolation performance. Also, since the antenna 106 is formed on the first surface, it is possible to readily radiate toward the first surface seen from the second surface.

Fifth Embodiment

A wireless apparatus according to the fifth embodiment will be described with reference to FIGS. 12A and 12B.

Figure 12A:
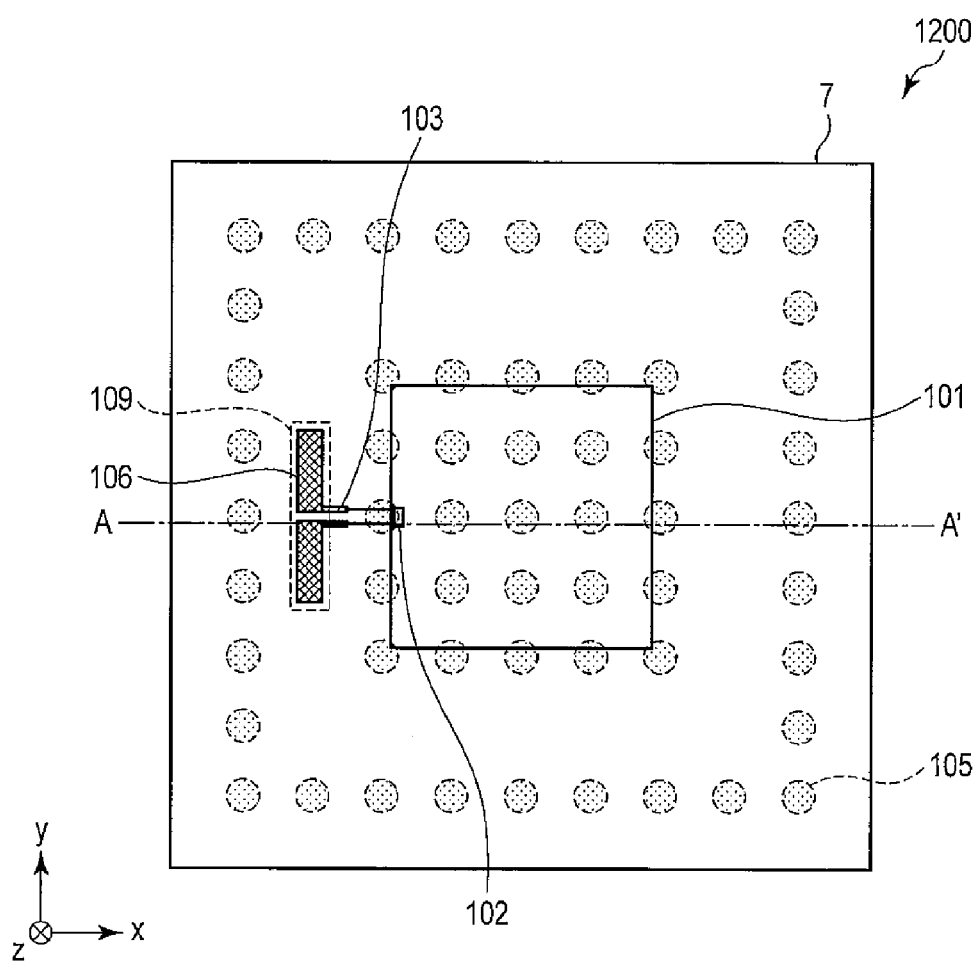
FIG. 12A is a perspective view illustrating a wireless apparatus according to the fifth embodiment.
Figure 12B:
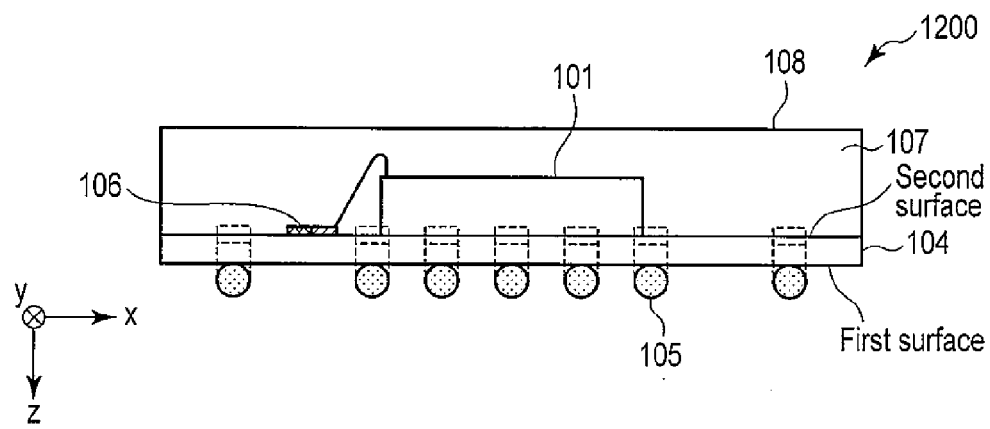
FIG. 12B is a sectional view illustrating the wireless apparatus according to the fifth embodiment.

FIG. 12A is a perspective view illustrating a wireless apparatus when seen from the −z direction. FIG. 12B is a sectional view taken along a line A-A' in FIG. 12A and illustrating the wireless apparatus when seen from the −y direction.

A wireless apparatus 1200 according to the fifth embodiment is different from the wireless apparatus 100 according to the first embodiment in that package terminals 105 are not arranged at equal intervals and some intervals of the package terminals 105 are wide. Furthermore, a main radiating part 109 of an antenna 106 is arranged at a position except for a region obtained by orthogonally projecting a region occupied by the package terminals 105 on a second surface. In the example of FIG. 12B, the main radiating part 109 is arranged at a position (to also be referred to as a third region) outside regions surrounded by broken lines on the second surface. In this arrangement, the package terminals 105 do not overlap the main radiating part 109 of the antenna 106 to keep a distance between them. Since, therefore, a current induced by the current of the antenna 106 in the package terminals 105 and wiring lines (not shown) connected to the package terminals 105 is decreased, the antenna characteristics do not degrade. That is, even if all the package terminals 105 are used for a connection between a semiconductor chip 101 and a board on which a semiconductor package 108 is mounted, the antenna characteristics do not degrade, thereby enabling to improve the degree of freedom of the wiring. Since it is possible to efficiently arrange the antenna 106 at a position outside a region obtained by orthogonally projecting the package terminals 105 on the second surface, the board size can be reduced.

A modification of the wireless apparatus according to the fifth embodiment will be described with reference to FIGS. 13A and 13B.

FIG. 13A is a perspective view illustrating a wireless apparatus when seen from the −z direction. FIG. 13B is a sectional view taken along a ling A-A' in FIG. 13A and illustrating the wireless apparatus when seen from the −y direction.

In this modification, the package terminals 105 are not arranged at the center of a board 104 and the antenna 106 is a patch antenna. The antenna 106 is arranged on the first surface, and is connected with an antenna terminal 102 and the power feeding port of the antenna 106 by a boding wire, bump, metal plate, or via. Since the antenna 106 is arranged on the first surface side, it is possible to readily radiate from the first surface toward the +z direction.

According to the above-described fifth embodiment, since the antenna 106 is arranged at a position outside a region obtained by orthogonally projecting the package terminals 105 on the second surface, a current induced in the package terminals 105 or the like is decreased, thereby enabling to prevent degradation in antenna characteristics. Since arranging the antenna 106 on the first surface of the board 104 increases an area usable for wiring on the second surface where there are no package terminals 105, it is possible to improve the degree of freedom of the wiring. Furthermore, since it is possible to efficiently arrange the main radiating part 109 of the antenna 106 at a position where there are no package terminals 105, the board size can be reduced. Since a surface on which the semiconductor chip 101 is arranged is different from that on which the antenna 106 is arranged, it is possible to provide a metal layer between the semiconductor chip 101 and the antenna 106, thereby improving the isolation performance. Also, since the main radiating part is formed on the first surface, it is possible to readily radiate toward the +z direction.

Sixth Embodiment

It is also possible to use the above-described wireless apparatus for a wireless system. An example of a wireless system including the wireless apparatus according to one of the first to fifth embodiments will be described with reference to FIGS. 14 and 15. The wireless system includes the above-described wireless apparatus and system exchanging data, images, or moving images.

A wireless system according to the sixth embodiment will be described with reference to a block diagram illustrated in FIG. 14.

Figure 14:
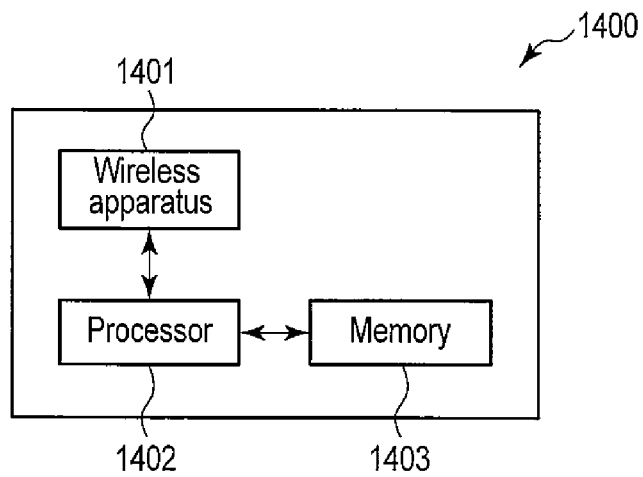
FIG. 14 is a block diagram illustrating a wireless system including a wireless apparatus.

A wireless system 1400 illustrated in FIG. 14 includes a wireless apparatus 1401, a processor 1402, and a memory 1403.

The wireless apparatus 1401 transmits and receives data. Note that the wireless apparatus according to any of the first to fifth embodiments may be used.

The processor 1402 processes data received from the wireless apparatus 1401 or data to be transmitted to the wireless apparatus 1401.

The memory 1403 receives data from the processor 1402 and saves it.

An example of the wireless system including the wireless apparatus will be described with reference to FIG. 15.

The wireless system is, for example, a note PC 1501 and portable terminal 1502. The note PC 1501 and portable terminal 1502 internally or externally includes the wireless apparatus, and performs data communication via the wireless apparatus using, for example, a millimeter-wave frequency. Although the note PC 1501 and portable terminal 1502 includes a wireless apparatus 100 in this example, any of the above-described wireless apparatuses may be mounted.

The wireless apparatus of the note PC 1501 and that of the portable terminal 1502 can efficiently exchange data when they are arranged so that the directions having high directivities of their antennas 106 oppose each other.

Figure 15:
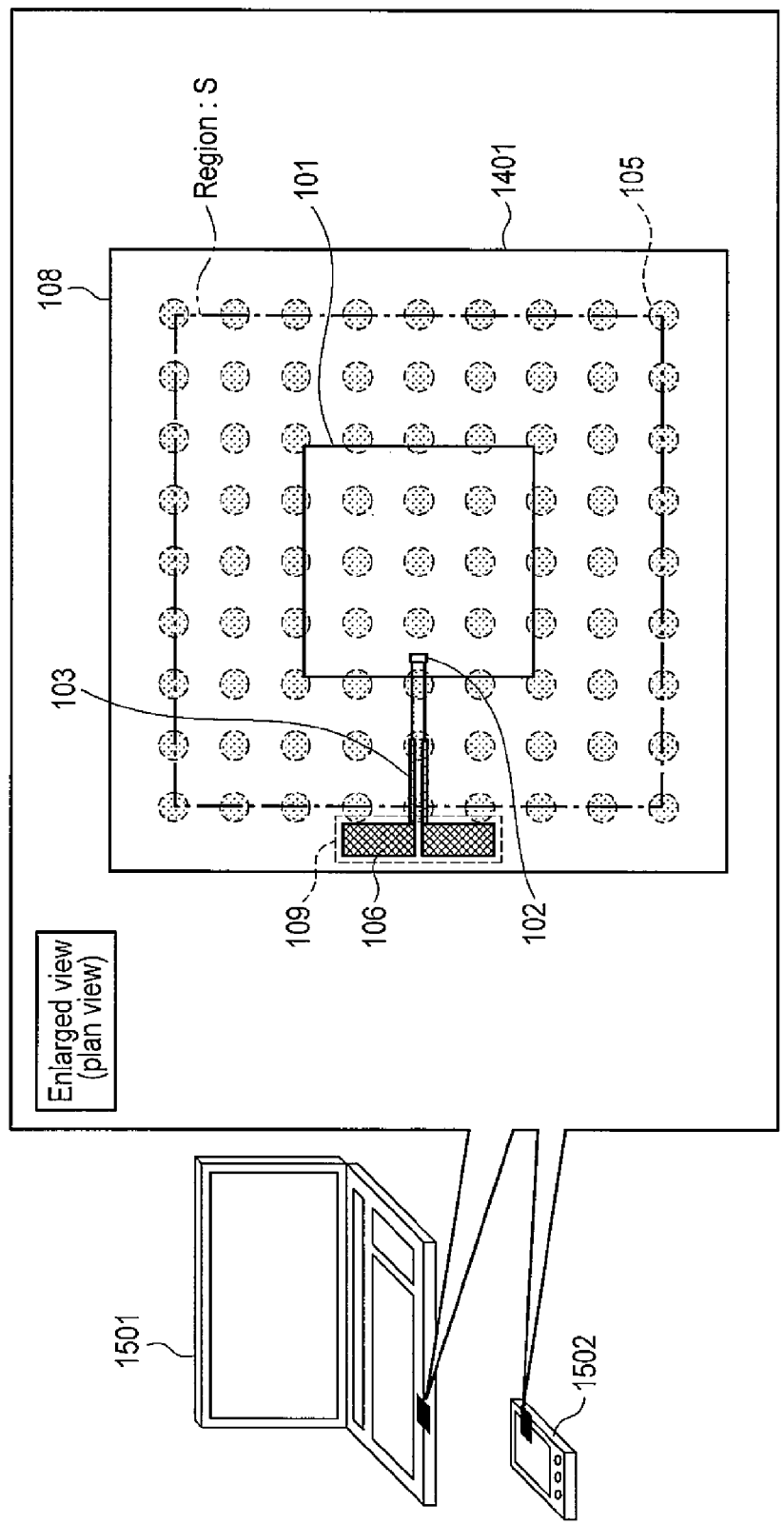
FIG. 15 is a view illustrating an example of the wireless system.

Although the note PC 1501 and portable terminal 1502 are illustrated in the example of FIG. 15, the present embodiment is not limited to them. The wireless apparatus may be included in other systems such as a TV, digital camera, and memory card.

Figure 16:
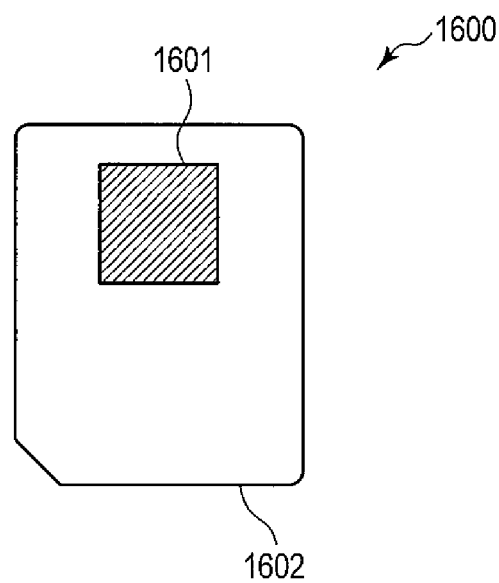
FIG. 16 is a view illustrating a case in which a memory card includes a wireless apparatus.

FIG. 16 illustrates a case in which a memory card includes the wireless apparatus.

As illustrated in FIG. 16, a memory card 1600 includes a wireless apparatus 1601 and a memory card main body 1602, and can make wireless communication with a note PC, a portable terminal, a digital camera, or the like via the wireless apparatus 1601.

According to the above-described sixth embodiment, by including a wireless apparatus in a wireless system for wirelessly communicating data, such as a note PC or portable terminal, it is possible to efficiently transmit/receive data and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless apparatus, comprising:
an antenna including a main radiating part;
a semiconductor chip coupled to the antenna; and
a board having a first surface and a second surface which is different from the first surface, a plurality of terminals being arranged on the first surface, and the semiconductor chip being arranged on the second surface,
wherein when viewed along a first direction perpendicular to the second surface, the main radiating part is arranged outside a first region and a second region,
wherein the first region is an area having two dimensions on the first surface which is delimited by imaginary lines passing through centers of peripheral terminals among the terminals, and the second region is an area on the second surface where the first region is orthogonally projected onto the second surface.

2. The apparatus according to claim 1, wherein the semiconductor chip is arranged at a position shifted from a center of the board when viewed along the first direction.

3. The apparatus according to claim 1, wherein the semiconductor chip is arranged closer to the antenna than a center of the board when viewed along the first direction.

4. The apparatus according to claim 1, wherein the main radiating part is arranged on the second surface.

5. The apparatus according to claim 1, wherein the main radiating part is arranged on the first surface or arranged between the first surface and the second surface.

6. The apparatus according to claim 1, wherein the main radiating part is a portion of the antenna with highest radiation intensity at an operating frequency.

7. A wireless system, comprising:
the apparatus according to claim 1;
a processor configured to process data; and
a memory configured to save the data.

8. A notebook PC, comprising the apparatus according to claim 1.

9. A portable terminal, comprising the apparatus according to claim 1.

10. A memory card, comprising the apparatus according to claim 1.

11. A wireless apparatus, comprising:
an antenna including a main radiating part;
a semiconductor chip coupled to the antenna; and
a board having a first surface and a second surface which is different from the first surface, a plurality of terminals being arranged on the first surface, and the semiconductor chip being arranged on the second surface,
wherein when viewed along a first direction perpendicular to the second surface, the main radiating part is arranged in a third region other than a first region and a second region, wherein the first region is an area having two dimensions on the first surface which is occupied and delimited by the terminals, and the second region is an area on the second surface where the first region is orthogonally projected onto the second surface.

12. The apparatus according to claim 11, wherein the semiconductor chip is arranged at a position shifted from a center of the board when viewed along the first direction.

13. The apparatus according to claim 11, wherein the semiconductor chip is arranged closer to the antenna than a center of the board when viewed along the first direction.

14. The apparatus according to claim 11, wherein the main radiating part is arranged on the second surface.

15. The apparatus according to claim 11, wherein the main radiating part is arranged on the first surface or arranged between the first surface and the second surface.

16. The apparatus according to claim 11, wherein the main radiating part is a portion of the antenna with highest radiation intensity at an operating frequency.

17. A wireless system, comprising:
the apparatus according to claim 11;
a processor configured to process data; and
a memory configured to save the data.

18. A notebook PC, comprising the apparatus according to claim 11.

19. A portable terminal, comprising the apparatus according to claim 11.

20. A memory card, comprising the apparatus according to claim 11.

* * * * *